United States Patent
Ishibashi et al.

(10) Patent No.: US 8,025,739 B2
(45) Date of Patent: Sep. 27, 2011

(54) METHOD OF MANUFACTURING SEMICONDUCTOR DEVICE

(75) Inventors: Kiyohisa Ishibashi, Toyama (JP); Yasuhiro Inokuchi, Toyama (JP); Atsushi Moriya, Toyama (JP); Yoshiaki Hashiba, Takaoka (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 12/571,706

(22) Filed: Oct. 1, 2009

(65) Prior Publication Data

US 2010/0087068 A1  Apr. 8, 2010

(30) Foreign Application Priority Data

Oct. 7, 2008  (JP) .................................. 2008-260630

(51) Int. Cl.
*B08B 7/02* (2006.01)
(52) U.S. Cl. .......................... 134/17; 438/905
(58) Field of Classification Search .................. 438/905; 134/17
See application file for complete search history.

(56) References Cited

U.S. PATENT DOCUMENTS

| | | | | |
|---|---|---|---|---|
| 4,740,290 A * | 4/1988 | Tomita et al. | ................... | 208/67 |
| 5,635,408 A * | 6/1997 | Sano et al. | ....................... | 438/58 |
| 5,788,799 A * | 8/1998 | Steger et al. | .............. | 156/345.37 |
| 5,983,906 A * | 11/1999 | Zhao et al. | ....................... | 134/1.1 |
| 6,375,756 B1 * | 4/2002 | Ishibashi | .......................... | 134/19 |
| 6,659,111 B1 * | 12/2003 | Mouri et al. | .................. | 134/22.1 |
| 6,844,273 B2 * | 1/2005 | Kato et al. | ....................... | 438/791 |
| 7,028,696 B2 * | 4/2006 | Richardson et al. | ........... | 134/1.1 |
| 7,156,923 B2 * | 1/2007 | Kato et al. | ....................... | 118/715 |
| 7,159,597 B2 * | 1/2007 | Hua et al. | ........................ | 134/1.1 |
| 7,651,955 B2 * | 1/2010 | Ranish et al. | .................. | 438/769 |

FOREIGN PATENT DOCUMENTS

JP  2002/334869  11/2002
KR  2004/0092469  11/2004

\* cited by examiner

*Primary Examiner* — N Drew Richards
*Assistant Examiner* — Grant S Withers
(74) *Attorney, Agent, or Firm* — Brundidge & Stanger, P.C.

(57) ABSTRACT

In a dry cleaning process, breakage of a gas supply pipe can be prevented, and maintenance efficiency can be increased. There is provided a method of manufacturing a semiconductor device, comprising: (a) loading a substrate into a process chamber; (b) forming a silicon film or a silicon compound film on the substrate loaded in the process chamber by supplying a raw-material gas to a gas supply pipe disposed in the process chamber to introduce the raw-material gas into the process chamber; (c) unloading the substrate from the process chamber; (d) heating an inside of the process chamber after unloading the substrate to generate a crack in a thin film formed inside the process chamber; (e) decreasing an inside temperature of the process chamber after carrying out the step (d) with the substrate unloaded from the process chamber; and (f) introducing a cleaning gas into the process chamber by supplying the cleaning gas to the gas supply pipe after the step (e) with the substrate unloaded from the process chamber.

2 Claims, 2 Drawing Sheets

METHOD OF MANUFACTURING SEMICONDUCTOR DEVICE

CROSS-REFERENCE TO RELATED PATENT APPLICATION

This U.S. non-provisional patent application claims priority under 35 U.S.C. §119 of Japanese Patent Application No. 2008-260630, filed on Oct. 7, 2008, in the Japanese Patent Office, the entire contents of which are hereby incorporated by

BACKGROUND OF THE INVENTION

1. Field of the Invention

The present invention relates to a method of manufacturing a semiconductor device, and more particularly, to a method of manufacturing a semiconductor device by processing a substrate while removing films formed on parts of a semiconductor manufacturing apparatus.

2. Description of the Prior Art

In a process of forming a silicon (Si)-based film by using a hot wall type chemical vapor deposition (CVD) apparatus, source gas and etch gas are supplied to the inside of a reaction furnace through a gas supply pipe. However, when gas is supplied from a gas supply source, films are deposited on quartz components (e.g., a reaction tube, a boat, and the gas supply pipe (including a nozzle)) as well as wafers, and if the thickness of the films exceeds 3 µm, the films may be stripped off and form particles.

Therefore, it is necessary to clean the quartz components periodically, and moreover, it is necessary to replace the quartz components with new components according to the wear of the quartz components. Wet etching can be performed (to remove Si-based films by using an etchant such as fluoroacetic acid and hydrogen fluoride) each time wafers are processed. However, in this case, since washing and drying processes are also necessary, maintenance time increases, and thus maintenance efficiency decreases. In addition, when a quartz component is detached, the inside of the reaction furnace is exposed to the outside atmosphere and thus can be contaminated. Therefore, it is not preferable to maintain a highly clean state.

For these reasons, dry etching may be alternatively performed to remove Si-based films by introducing cleaning gas (e.g., $ClF_3$) into the reaction furnace in a state where the quartz components are disposed in the apparatus in a nitrogen ($N_2$) atmosphere.

However, when an Si-based film forming process is performed, since the inside pressure of the gas supply pipe (including a nozzle) used for supplying source gas is higher than the inside pressure of the reaction furnace, a thicker film is deposited on the inside of the source gas supply pipe as compared with the inside of the reaction furnace. Therefore, stresses are accumulated in the gas supply pipe due to the thicker film. If cleaning gas is supplied through the gas supply pipe in which stresses are accumulated, the film deposited on the inside of the gas supply pipe is rapidly etched, and thus the accumulated stresses are rapidly released. This causes breakage of the gas supply pipe such as cracking of the gas supply pipe. Moreover, due to resultant particles and replacement of the gas supply pipe after a dry cleaning process, maintenance efficiency decreases.

SUMMARY OF THE INVENTION

An object of the present invention is to prevent breakage of a gas supply pipe during a dry cleaning process and improve maintenance efficiency.

According to an aspect of the present invention, there is provided a method of manufacturing a semiconductor device, comprising: (a) loading a substrate into a process chamber; (b) forming a silicon film or a silicon compound film on the substrate loaded in the process chamber by supplying a raw-material gas to a gas supply pipe disposed in the process chamber to introduce the raw-material gas into the process chamber; (c) unloading the substrate from the process chamber; (d) heating an inside of the process chamber after unloading the substrate to generate a crack in a thin film formed inside the process chamber; (e) decreasing an inside temperature of the process chamber after carrying out the step (d) with the substrate unloaded from the process chamber; and (f) introducing a cleaning gas into the process chamber by supplying the cleaning gas to the gas supply pipe after the step (e) with the substrate unloaded from the process chamber.

DETAILED DESCRIPTION OF THE PREFERRED EMBODIMENTS

Preferable embodiments of the present invention will be described hereinafter with reference to the attached drawings.

A substrate process apparatus relevant to the current embodiment is an example of semiconductor manufacturing apparatuses used for manufacturing semiconductor device integrated circuits (ICs). In the following description, as an example of a substrate processing apparatus, a vertical type apparatus configured to perform a process such as a heat treatment process will be explained.

Figure 1:
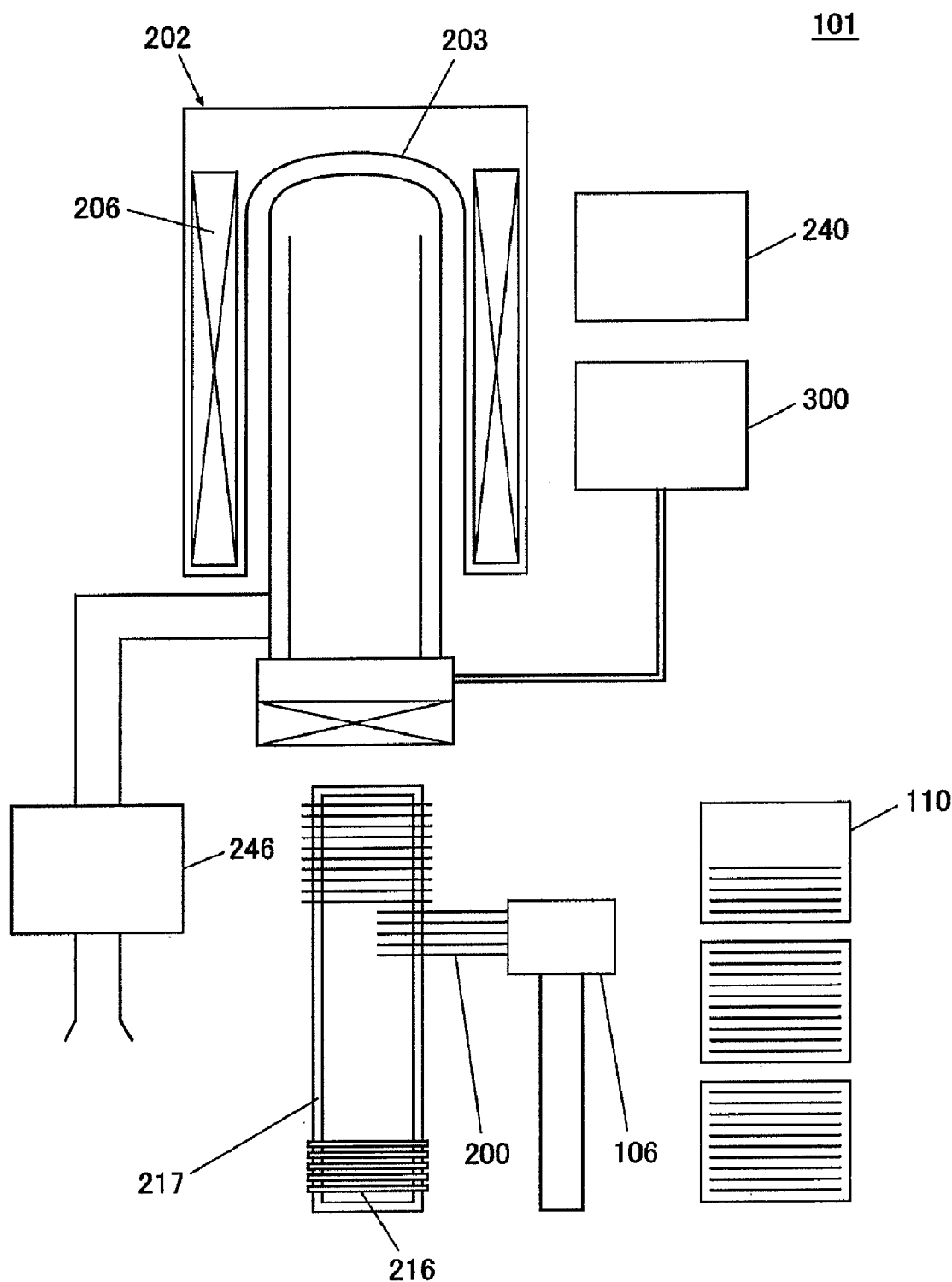
FIG. 1 is a schematic view illustrating a substrate processing apparatus.

FIG. 1 is a schematic view illustrating a substrate processing apparatus 101 according to an embodiment of the present invention.

As shown in FIG. 1, the substrate processing apparatus 101 includes a gas supply system 300, a transfer unit 106, cassettes 110, a process furnace 202, a boat 217, a controller 240, and a vacuum exhaust device 246.

The cassettes 110 are accommodated in the substrate processing apparatus 101, and each of the cassettes 110 holds a plurality of wafers 200 in a state where the wafers 200 are arranged and horizontally oriented. The wafers 200 are made of a material such as silicon and have a disk shape.

The transfer unit 106 is used to transfer the wafers 200 from the cassettes 110 to the boat 217, or from the boat 217 to the cassettes 110. For this end, the transfer unit 106 has a wafer pickup structure. That is, the transfer unit 106 is configured to charge wafers 200 into the boat 217 and discharge the wafers 200 from the boat 217. The boat 217 is placed under the process furnace 202 when a film forming process is not performed.

The process furnace 202 includes a heater 206 and a process tube 203. The heater 206 is installed around the process tube 203 and configured to heat the process tube 203. The gas supply system 300 is connected to the process furnace 202 to supply various process gases, and the vacuum exhaust device 246 is connected to the process furnace 202 to evacuate the inside of the process furnace 202. The process furnace 202 will be described later in more detail.

The controller 240 controls operations of the substrate processing apparatus 101.

Figure 2:
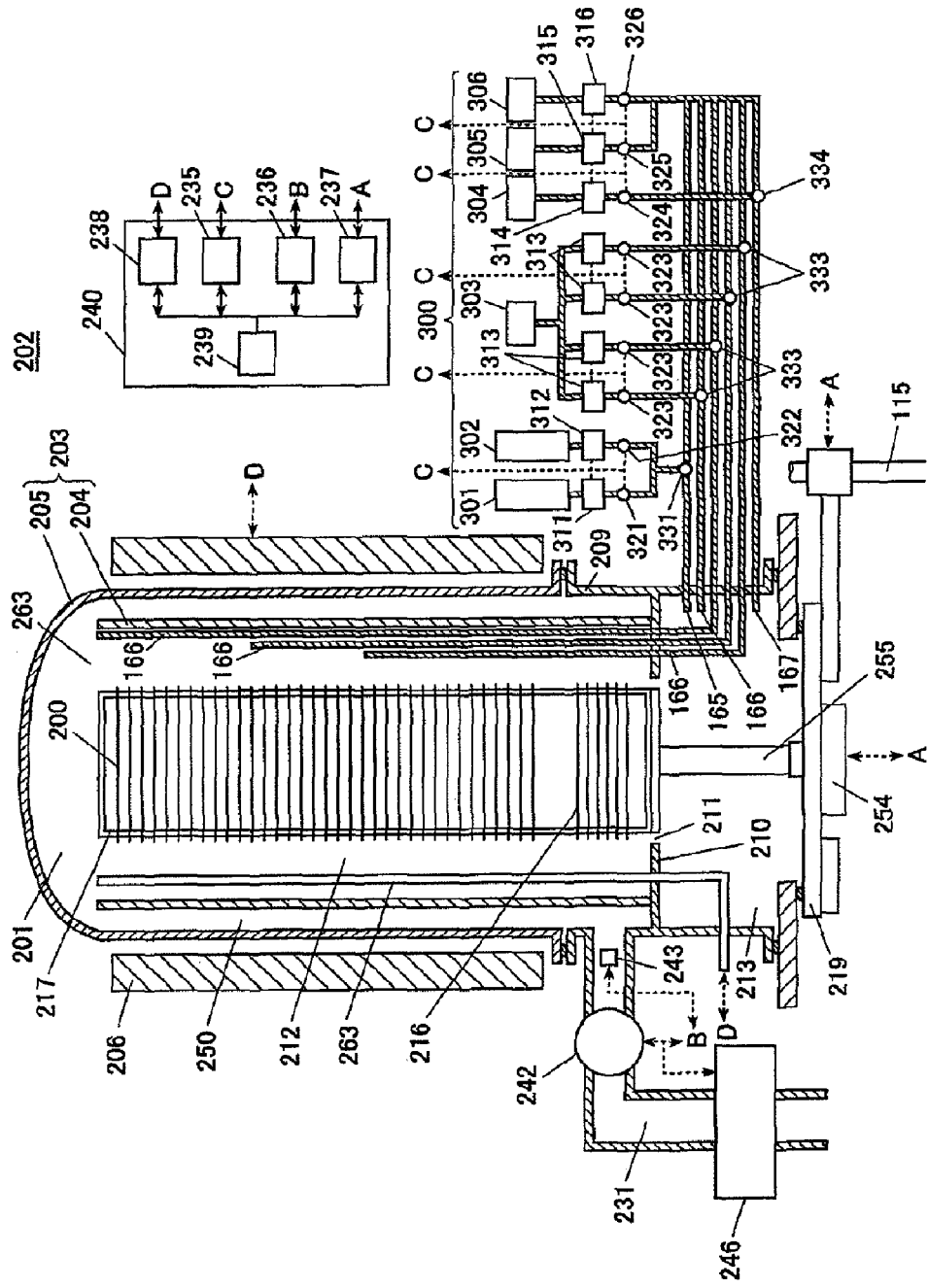
FIG. 2 is a schematic view illustrating a processing furnace.

FIG. 2 is a schematic vertical sectional view illustrating the process furnace 202 of the substrate processing apparatus 101. In FIG. 2, wafers 200 and the boat 217 are loaded in a process chamber 201. The process furnace 202 will now be described with reference to FIG. 2.

As already explained in FIG. 1, the process furnace 202 includes the heater 206 as a heating mechanism. The heater 206 has a cylindrical shape. The heater 206 includes a heating wire and a heat-resistant material disposed around the heating wire. The heater 206 is vertically installed in a state where the heater 206 is supported by a holder (not shown).

Inside the heater 206, the process tube 203 is installed coaxially with the heater 206. The process tube 203 includes an inner tube 204 as an inner reaction tube, and an outer tube 205 installed outside the inner tube 204 as an outer reaction tube.

The outer tube 205 is made of a heat-resistant material such as quartz ($SiO_2$) and silicon carbide (SiC). The outer tube 205 has a cylindrical shape with a closed top side and an opened bottom side.

The inner tube 204 is made of a heat-resistant material such as quartz ($SiO_2$) and silicon carbide (SiC). The inner tube 204 has a cylindrical shape with opened top and bottom sides. The inner tube 204 is installed inside the outer tube 205. The inner tube 204 and the outer tube 205 are coaxial with each other, and the outer diameter of the inner tube 204 is smaller than the inner diameter of the outer tube 205. Therefore, a cylindrical space 250 is formed between the inner tube 204 and the outer tube 205. The top side of the inner tube 204 is spaced downward from the ceiling of the outer tube 205, and the top side of a hollow region 212 of the inner tube 204 communicates with the top side of the cylindrical space 250.

Under the inner tube 204 and the outer tube 205, a manifold 209 is installed. The manifold 209 is made of a metal such as stainless steel. The manifold 209 has a cylindrical shape with opened top and bottom sides.

A middle plate 210 is formed on the inside of the manifold 209 at a vertical center position, and a penetration hole 211 is formed through a center part of the middle plate 210.

The manifold 209 has the same diameter as that of the outer tube 205. The top side of the manifold 209 is connected to the bottom side of the outer tube 205, and the outer tube 205 is supported by the manifold 209. The inner tube 204 is installed in a state where the inner tube 204 is erected on the middle plate 210, and the penetration hole 211 is positioned inside the diameter of the inner tube 204. An O-ring is installed between the outer tube 205 and the manifold 209 as a seal member. The manifold 209 is supported by a holder (not shown) so that the process tube 203 can be vertically installed.

A reaction vessel is constituted by the process tube 203 and the manifold 209. The process chamber 201 formed in the reaction vessel is divided into the hollow region 212 of the inner tube 204, the cylindrical space 250 formed between the inner tube 204 and the outer tube 205, and a lower-side space 213 (hollow region) of the manifold 209 located under the middle plate 210.

Under the manifold 209, a seal cap 219 is installed as a furnace port cover for air-tightly closing the opened bottom side of the manifold 209. The seal cap 219 is made of a metal such as stainless steel and has a cylindrical shape. On the top surface of the seal cap 219, an O-ring is installed as a seal member making contact with the bottom side of the manifold 209.

At the seal cap 219, a rotary mechanism 254 is installed. A rotation shaft 255 of the rotary mechanism 254 is connected to the boat 217 through the seal cap 219. The rotary mechanism 254 is configured to rotate wafers 200 by rotating the boat 217. The seal cap 219 is configured to be vertically lifted and lowered by a lift motor 248 installed outside the process furnace 202 as a lift mechanism. By this, the boat 217 can be loaded into and out of the process chamber 201. A driving control unit 237 is electrically connected to the rotary mechanism 254 and a boat elevator 115 so as to perform a desired operation at a desired time.

The boat 217 used as a substrate holding unit is made of a heat-resistant material such as quartz ($SiO_2$) and silicon carbide (SiC). The boat 217 is configured to hold a plurality of wafers 200 (for example, fifty to one hundred fifty wafers 200) in a state where the wafers 200 are horizontally oriented and are arranged in multiple stages with centers of the wafers 200 being aligned. At the lower part of the boat 217, a plurality of insulating plates 216, which are made of a heat-resistance material such as quartz ($SiO_2$) and silicon carbide (SiC) and have a disk shape, are horizontally oriented and arranged in multiple stages so as to prevent heat transfer from the heater 206 to the manifold 209.

In addition, a temperature sensor 263 is installed inside the inner tube 204.

A temperature control unit 238 is electrically connected to the heater 206 and the temperature sensor 263 so as to control power supplied to the heater 206 based on temperature information detected using the temperature sensor 263, so that desired temperature distribution can be obtained inside the process chamber 201 at a desired time.

A gas supply pipe 165, a gas supply pipe 167, and four gas supply pipes 166 are installed at the manifold 209. The gas supply pipes 165, 166, and 167 extend from an outside area of the manifold 209 to the inside of the process chamber 201 through the manifold 209. Downstream end parts of the gas supply pipes 165, 166, and 167 are configured as nozzles.

The downstream end part of the gas supply pipe 165 is located in the lower-side space 213 of the manifold 209. The upstream side of the gas supply pipe 165 is connected to a directional control valve 331. The directional control valve 331 is three-port directional control valve. A first port of the directional control valve 331 is connected to the gas supply pipe 165. A second port of the directional control valve 331 is connected to a raw-material gas supply source 301 through a valve 321 and a mass flow controller (MFC) 311, and the second port of the directional control valve 331 is also connected to a dilute gas supply source 302 through a valve 322 and an MFC 312. A third port of the directional control valve 331 is connected to an inert gas supply source 305 through a valve 325 and an MFC 315, and the third port of the directional control valve 331 is also connected to a cleaning gas supply source 306 through a valve 326 and an MFC 316. The directional control valve 331 has first and second switching positions (two switching positions). If the directional control valve 331 is switched to the first switching position, the gas supply pipe 165 is connected to the valve 321 and the valve 322, and when the directional control valve 331 is switched to the second switching position, the gas supply pipe 165 is connected to the valve 325 and the valve 326.

The downstream end part of one of the four gas supply pipes 166 is located in the lower-side space 213, and the downstream end parts of the other three gas supply pipes 166 are located at different heights in the hollow region 212 of the inner tube 204. The upstream sides of the gas supply pipes 166 are connected to first ports of directional control valves 333. Second ports of the directional control valves 333 are connected to a raw-material gas supply source 303 through valves 323 and MFCs 313. Third ports of the directional control valves 333 are connected to the inert gas supply source 305 through the valve 325 and the MFC 315, and the third ports of the directional control valves 333 are also connected to the cleaning gas supply source 306 through the valve 326 and the MFC 316. Each of the directional control valves 333 has first and second switching positions (two switching positions). If the directional control valves 333 are switched to the first switching positions, the gas supply pipes 166 are connected to the valves 323, and if the directional control valves 333 are switched to the second switching positions, the gas supply pipes 166 are connected to the valve 325 and the valve 326.

The downstream end part of the gas supply pipe 167 is located in the lower-side space 213. The upstream side of the gas supply pipe 167 is connected to a first port of a directional control valve 334. A second port of the directional control valve 334 is connected to a etch gas supply source 304 through a valve 324 and an MFC 314. A third port of the directional control valve 334 is connected to the inert gas supply source 305 through the valve 325 and the MFC 315, and the third port of the directional control valve 334 is also connected to the cleaning gas supply source 306 through the valve 326 and the MFC 316. The directional control valve 334 has first and second switching positions (two switching positions). If the directional control valve 334 is switched to the first switching position, the gas supply pipe 167 is connected to the valve 324, and if the directional control valve 334 is switched to the second switching position, the gas supply pipe 167 is connected to the valve 325 and the valve 326.

Silane gas such as monosilane ($SiH_4$) is filled in the raw-material gas supply source 301. Dilute gas such as hydrogen gas and helium gas is filled in the dilute gas supply source 302. Germanium-based gas such as monogermane gas ($GeH_4$) is filled in the raw-material gas supply source 303. Etch gas such as chlorine gas and hydrogen chloride gas is filled in the etch gas supply source 304. Inert gas such as nitrogen gas and argon gas is filled in the inert gas supply source 305. Cleaning gas such as Chlorine trifluoride ($ClF_3$) is filled in the cleaning gas supply source 306.

The MFCs 311 to 316 are gas flowrate control devices configured to detect and control gas flowrates.

A gas flowrate control unit 235 is electrically connected to the MFCs 311 to 316 and the valves 321 to 326 so to control gas supply, so that gas can be supplied with a desired flowrate at a desired time. The gas flowrate control unit 235 is electrically connected to the directional control valves 331, 333, and 334, so as to control switching positions of the directional control valves 331, 333, and 334.

A gas exhaust pipe 231 is installed at the manifold 209 and is connected to the cylindrical space 250. The vacuum exhaust device 246 such as a vacuum pump is connected to the downstream side of the gas exhaust pipe 231 through a pressure sensor 243 used as a pressure detector and an automatic pressure control (APC) valve 242 used as a pressure regulator. A pressure control unit 236 is electrically connected to the pressure sensor 243 and the APC valve 242, and the opened degree of the APC valve 242 is adjusted based on pressure information detected using the pressure sensor 243, so that the inside pressure of the process chamber 201 can be adjusted to a desired level at a desired time.

The gas flowrate control unit 235, the pressure control unit 236, the driving control unit 237, and the temperature control unit 238 constitute a manipulation unit and an input/output unit and are electrically connected to a main control unit 239 configured to control the overall operation of the substrate processing apparatus 101. The controller 240 is constituted by the gas flowrate control unit 235, the pressure control unit 236, the driving control unit 237, the temperature control unit 238, and the main control unit 239.

Next, a method of manufacturing a semiconductor device will be described together with main operations of the above-described substrate processing apparatus 101. In the following description, respectively parts of the substrate processing apparatus 101 are controlled by the controller 240.

Substrate processing operations will now be described.

When a plurality of cassettes 110 is carried into the substrate processing apparatus 101 by an in-plant carrying device (not shown), the transfer unit 106 charges wafers 200 into the boat 217 from the cassettes 110 (wafer charging). After the transfer unit 106 transfers wafers 200 to the boat 217, the transfer unit 106 goes back to the cassettes 110 for transferring the next wafers 200 to the boat 217.

After a predetermined number of wafers 200 are charged into the boat 217, the controller 240 controls the driving control unit 237 to initiate a lifting operation of the boat elevator 115. Then, the boat 217 in which a group of wafers 200 are held is loaded into the process furnace 202 by the lifting operation of the boat elevator 115 (boat loading), the opened bottom side of the manifold 209 is closed by the seal cap 219. In this way, the controller 240 operates the boat elevator 115 through the driving control unit 237.

Next, the controller 240 controls the pressure control unit 236 to operate the vacuum exhaust device 246, and then the inside of the process chamber 201 is evacuated to a desired pressure (vacuum degree) by the vacuum exhaust device 246. At this time, the inside pressure of the process chamber 201 is measured using the pressure sensor 243, and based on the measured pressure, the APC valve 242 is feedback-controlled by the pressure control unit 236 of the controller 240.

In addition, the controller 240 controls the temperature control unit 238 to operate the heater 206, and thus the inside of the process chamber 201 is heated to a desired temperature by the heater 206. At this time, to obtain desired temperature distribution inside the process chamber 201, power to the heater 206 is feedback-controlled by the temperature control unit 238 of the controller 240 based on temperature information detected by the temperature sensor 263.

Next, the controller 240 controls the driving control unit 237 to operate the rotary mechanism 254. Then, the boat 217 is rotated by the rotary mechanism 254, and thus the wafers 200 held in the boat 217 can be rotated. The operation of the rotary mechanism 254 is continued.

Next, the controller 240 controls the gas flowrate control unit 235 to switch the directional control valve 331 for connecting the gas supply pipe 165 to the valves 321 and 322. Similarly, the directional control valves 333 and 334 are switched so that the gas supply pipes 166 can be connected to the valves 323 and the gas supply pipe 167 can be connected to the valve 324.

Thereafter, the controller 240 controls the gas flowrate control unit 235 so as to set the flowrates of the MFCs 311 to 314 to predetermined values and open the valves 321 to 324. Then, a mixture of silane gas and dilute gas is introduced into the process chamber 201 through the gas supply pipe 165, germanium-based gas is introduced into the process chamber 201 through the gas supply pipes 166, and etching gas is introduced into the process chamber 201 through the gas supply pipe 167. The gases introduced into the process chamber 201 flow upward in the hollow region 212 of the inner tube 204 and enter the cylindrical space 250 through the opened top side of the inner tube 204. Then, the gases are discharged from the cylindrical space 250 through the gas exhaust pipe 231. When the gases flows through the process chamber 201, the gases make contact with the wafers 200 so that epitaxial silicon germanium (Epi-SiGe) films can be selectively grown on the surfaces of the wafers 200. In addition, films (e.g., Epi-SiGe films) are grown on components such as the inner tube 204 and the outer tube 205. Such films are also grown on the inner walls of the gas supply pipes 165, 166, and 167.

Alternatively, the controller 240 may close the valves 323 and open the valves 321, 322, and 324. In this case, germanium-based gas is not introduced into the process chamber 201, and thus Epi-Si films may be selectively grown on the surfaces of the wafers 200. If the substrate processing apparatus 101 is used to form only Epi-Si films on wafers 200, the raw-material gas supply source 303, the MFCs 313, the valves 323, the directional control valves 333, and the gas supply pipes 166 are not installed.

Alternatively, the controller 240 may close the valve 324 and open the valves 321, 322, and 323. In this case, etch gas is not introduced into the process chamber 201, and thus poly-SiGe films may be deposited on the surfaces of the wafers 200.

Alternatively, the controller 240 may close the valves 323 and 324 and open the valves 321 and 322. In this case, etch gas and germanium-based gas are not introduced into the process chamber 201, and thus Epi-Si films may be deposited on the surfaces of the wafers 200.

After a predetermined time interval from the instruction of the gases, the controller 240 closes the valves 321 to 324. Thereafter, the controller 240 switches the directional control valves 331, 333, and 334. Then, the gas supply pipe 165 is connected to the valve 325 through the directional control valve 331, the gas supply pipes 166 are connected to the valve 325 through the directional control valves 333, and the gas supply pipe 167 is connected to the valve 325 through the directional control valve 334.

After that, the controller 240 sets the flowrate of the MFC 315 to a predetermined value and opens the valve 325. Then, inert gas is introduced into the process chamber 201 from the inert gas supply source 305 through the gas supply pipes 165, 166, and 167. As a result, the inside atmosphere of the process chamber 201 is replaced with the inert gas, and at the same, the inside pressure of the process chamber 201 returns to atmospheric pressure.

Next, the controller 240 controls the driving control unit 237 to stop the rotary mechanism 254 and initiate a lowering operation of the boat elevator 115. As the seal cap 219 and the boat 217 are moved downward by the lowering operation of the boat elevator 115, the bottom side of the manifold 209 is opened, and at the same time, the boat 217 in which the wafers 200 are held is unloaded from the process chamber 201 (boat unloading). Thereafter, the transfer unit 106 transfers the processed wafers 200 from the boat 217 to the cassettes 110. The cassettes 110 in which the processed wafers 200 are placed are carried to the outside of the substrate processing apparatus 101 by the in-plant carrying device (not shown).

Thereafter, the above-described substrate processing operations are repeated for processing the next wafers 200 sequentially. When the above-described substrate processing operations are repeated, a cleaning operation is performed on the process furnace 202. The cleaning operation is performed each time the above-described substrate processing operations are repeated once or a predetermined number of times. Hereinafter, the cleaning operation will now be described in detail.

In a state where no wafer 200 is placed in the boat 217 after processed wafers 200 are transferred from the boat 217 to cassettes 110, the controller 240 initiate the lifting operation of the boat elevator 115.

Next, the controller 240 switches the directional control valves 331, 333, and 334. Then, the gas supply pipe 165 is connected to the valves 325 and 326 through the directional control valve 331, the gas supply pipes 166 are connected to the valves 325 and 326 through the directional control valves 333, and the gas supply pipe 167 is connected to the valves 325 and 326 through the directional control valve 334.

Next, the controller 240 keeps the valve 325 opened. In addition, the opened degree of the APC valve 242 is feedback-controlled by the controller 240 based on pressure information detected and input by the pressure sensor 243. Then, inert gas is introduced into the process chamber 201 to fill the inside of the process chamber 201 at a pressure of 50 Pa to 500 Pa.

Next, the controller 240 controls the temperature control unit 238 to operate the heater 206 for heating the process chamber 201 and parts of the gas supply pipes 165, 166, and 167 placed inside the process chamber 201. At this time, the controller 240 inputs a temperature measured by the temperature sensor 263 for feedback-controlling the heater 206 and keeping the rate of temperature increase caused by the heater 206 within the range of 10° C./min to 30° C./min. Preferably, the process chamber 201 may be heated to a temperature of 750° C. to 800° C. in 30 minutes from the initiation of heating.

During the temperature increasing process, the controller 240 compares a temperature detected by the temperature sensor 263 with an upper threshold value (ranging from 600° C. to 900° C., preferably, from 750° C. to 800° C.). If the temperature of the process chamber 201 and the gas supply pipes 165, 166, and 167 increases to a temperature of 600° C. to 900° C. (preferably, 750° C. to 800° C.), the controller 240 recognizes that a temperature detected by the temperature sensor 263 reaches the upper threshold value, and the controller 240 stops or lowers the heating operation of the heater 206. Then, the temperature of the process chamber 201 and the gas supply pipes 165, 166, and 167 is decreased. If the gas supply pipes 165, 166, and 167 are heated to a temperature of 600° C. to 900° C. as described above, cracks are generated in films formed on the insides of the gas supply pipes 165, 166, and 167, and thus residual stresses of the gas supply pipes 165, 166, and 167 are reduced. Owing to the same reason, cracks are generated in films formed on the boat 217, the inner tube 204, and the outer tube 205, and thus residual stresses of the boat 217, the inner tube 204, and the outer tube 205 are reduced.

During the temperature lowering process, the controller 240 compares a temperature detected by the temperature sensor 263 with an lower threshold value (ranging from 350° C. to 550° C.). If the temperature of the process chamber 201 and the gas supply pipes 165, 166, and 167 decreases to a temperature of 350° C. to 550° C., the controller 240 recognizes that a temperature detected by the temperature sensor 263 reaches the lower threshold value. Then, the controller 240 sets the flowrate of the MFC 315 to a value of 1000 sccm to 4500 sccm and the flowrate of the MFC 316 to a value of 500 sccm to 2500 sccm. In addition, the controller 240 keeps the valves 325 and 326 opened.

Then, cleaning gas and inert gas are introduced into the process chamber 201 through the gas supply pipes 165, 166, and 167. Since cleaning gas flows through the gas supply pipes 165, 166, and 167, films formed on the insides of the gas supply pipes 165, 166, and 167 are removed by dry etching. As described above, since the films are previously heated to form cracks in the films, the residual stresses of the gas supply pipes 165, 166, and 167 are not greatly varied by the removing of the films. Therefore, the gas supply pipes 165, 166, and 167 can be prevented from being damaged during the film etching process.

The cleaning gas and inert gas introduced into the process chamber 201 flow upward in the hollow region 212 of the inner tube 204 and enter the cylindrical space 250 through the opened top side of the inner tube 204. Then, the gases are discharged from the cylindrical space 250 through the gas exhaust pipe 231. Since cleaning gas flows through the process chamber 201 in this way, films formed on the boat 217, the inner tube 204, and the outer tube 205 can be etched away.

While the cleaning gas and inert gas are introduced, the flowrate of the cleaning gas is adjusted to the set value of 500 sccm to 2500 sccm of the MFC 316, and the flowrate of the inert gas is adjusted to the set valve of 1000 sccm to 4500 sccm of the MFC 315. The inert gas is used to dilute the cleaning gas.

In addition, while the cleaning gas and inert gas are introduced, the controller 240 inputs a pressure detected by the pressure sensor 243 and adjusts the opened degree of the APC valve 242 based on the detected pressure by feedback controlling. In this way, the inside of the process chamber 201 is kept at a pressure of 50 Pa to 500 Pa.

In addition, while the cleaning gas and inert gas are introduced, the controller 240 inputs a temperature detected by the temperature sensor 263 and controls power supplied to the heater 206 based on the detected temperature by feedback controlling (isothermal controlling). In this way, the inside of the process chamber 201 is kept at a temperature of 350° C. to 550° C.

After a predetermined time from the introduction of the cleaning gas and inert gas through the valves 325 and 326 which are kept opened by the controller 240, the valve 326 is closed by the controller 240. As a result, cleaning gas is not supplied, and only inert gas is supplied to the inside of the process chamber 201, so that the inside atmosphere of the process chamber 201 is replaced with inert gas and the inside pressure of the process chamber 201 returns to atmospheric pressure.

Next, quartz components (the inner tube 204, the outer tube 205, the boat 217, and the gas supply pipes 165, 166, and 167 including nozzles) of the substrate processing apparatus 101 are coated with silicon (Si). By this coating, substrates can be prevented from being contaminated by quartz during a processing process.

Next, the controller 240 controls the pressure control unit 236 to operate the vacuum exhaust device 246, and then the inside of the process chamber 201 is evacuated to a desired pressure (vacuum degree) by the vacuum exhaust device 246. At this time, the inside pressure of the process chamber 201 is measured using the pressure sensor 243, and based on the measured pressure, the APC valve 242 is feedback-controlled by the pressure control unit 236 of the controller 240.

In addition, the controller 240 controls the temperature control unit 238 to operate the heater 206, and thus the inside of the process chamber 201 is heated to a desired temperature by the heater 206. At this time, to obtain desired temperature distribution inside the process chamber 201, power to the heater 206 is feedback-controlled by the temperature control unit 238 of the controller 240 based on temperature information detected by the temperature sensor 263.

Next, the controller 240 controls the driving control unit 237 to operate the rotary mechanism 254. Then, the boat 217 is rotated by the rotary mechanism 254, and thus the wafers 200 held in the boat 217 can be rotated. The operation of the rotary mechanism 254 is continued.

Next, the controller 240 controls the gas flowrate control unit 235 to switch the directional control valve 331 so as to connecting the gas supply pipe 165 to the valves 321 and 322. Thereafter, the controller 240 controls the gas flowrate control unit 235 to set the flowrates of the MFCs 311 and 312 to predetermined values and open the valves 321 and 322. Then, a mixture of silane gas and dilute gas is introduced into the process chamber 201 through the gas supply pipe 165. The silane gas and dilute gas introduced into the process chamber 201 flow upward in the hollow region 212 of the inner tube 204 and enter the cylindrical space 250 through the opened top side of the inner tube 204. Then, the silane gas and inert gas are discharged from the cylindrical space 250 through the gas exhaust pipe 231. When the gases flow through the process chamber 201, the gases makes contact with quartz components of the substrate processing apparatus 101. Therefore, the quartz components are previously coated with silicon (Si) as described above.

Next, the controller 240 initiates the lowing operation of the boat elevator 115. Then, the seal cap 219 and the boat 217 are moved downward by the boat elevator 115.

Thereafter, the above-described substrate processing processes are performed again.

According to the above-described embodiment of the present invention, a temperature increasing process is performed prior to introduction of cleaning gas so as to generate cracks in films formed on the gas supply pipes 165, 166, and 167 by raw-material gas, so that stresses remaining in the gas supply pipes 165, 166, and 167 can be reduced. Therefore, although the films are rapidly etched away from the gas supply pipes 165, 166, and 167 by cleaning gas, stresses remaining in the gas supply pipes 165, 166, and 167 are not rapidly released. Thus, breakage and deterioration of the gas supply pipes 165, 166, and 167 can be prevented. As a result, generation of particles caused by breakage of the gas supply pipes 165, 166, and 167 can be prevented, and the gas supply pipes 165, 166, and 167 can be less frequently replaced. Accordingly, the maintenance of the substrate processing apparatus 101 can be easily performed, and thus, maintenance costs and time can be reduced.

In addition to the gas supply pipes 165, 166, and 167, the boat 217, the inner tube 204, and the outer tube 205 can also be prevented from being damaged and deteriorated by etching.

In the above-described embodiment, after Si-based poly silicon films are formed, a cleaning process is performed using $ClF_3$ gas. However, the present invention can be applied to the case where a cleaning process is performed using $F_2$ gas after SiN-based films are formed by an atomic layer deposition (ALD) method or a chemical vapor deposition (CVD) method using gas and surface reactions.

In addition, the heating process prior to the introduction of cleaning gas may be performed by directly heating the gas supply pipes 165, 166, and 167 using a heater fixed to the gas supply pipes 165, 166, and 167. Furthermore, a temperature sensor fixed to the gas supply pipes 165, 166, and 167 may be used. Similarly, a heater or a temperature sensor may be fixed to the surfaces of the boat 217, the inner tube 204, and the outer tube 205.

According to the present invention, prior to supply of cleaning gas to the inside of the process chamber, the inside of the process chamber is heated to a temperature higher than a temperature at which the process chamber is kept when cleaning gas is supplied to the inside of the process chamber. Therefore, stresses caused by films formed on the inside of the substrate processing apparatus can be gradually removed, so that breakage of nozzles can be prevented. Accordingly, generation of particles caused by breakage of the nozzles can be reduced, and thus maintenance efficiency can be improved.

While preferred aspects and embodiments of the present invention have been described, the present invention also includes the following embodiments.

(Supplementary Note 1)

According to a preferred embodiment of the present invention, there is provided a method of manufacturing a semiconductor device, the method including: loading a substrate into a process chamber; forming a silicon film or a silicon compound film on the substrate loaded in the process chamber by supplying a raw-material gas to a gas supply pipe disposed in the process chamber to introduce the raw-material gas into the process chamber; unloading the substrate from the process chamber; heating an inside of the process chamber; decreasing an inside temperature of the process chamber after the heating of the inside of the process chamber; and introducing a cleaning gas into the process chamber by supplying the cleaning gas to the gas supply pipe after the decreasing of the inside temperature of the process chamber.

(Supplementary Note 2)

In the method of Supplementary Note 1, the inside of the process chamber is heated to a temperature of 600° C. to 900° C. in the heating of the inside of the process chamber; the inside temperature of the process chamber is decreased to a temperature of 350° C. to 550° C. in the decreasing of the inside temperature of the process chamber; and the inside temperature of the process chamber is kept in a range from 350° C. to 550° C. in the introducing of the cleaning gas into the process chamber.

(Supplementary Note 3)

According to another preferred embodiment of the present invention, there is provided a substrate processing apparatus including: a process chamber configured to process a substrate; a heater configured to heat an inside of the process chamber; a gas supply pipe installed in the process chamber; a gas supply system configured to supply at least a cleaning gas to the gas supply pipe for introducing the cleaning gas into the process chamber; and a control unit configured to perform a process of heating the inside of the process chamber by using the heater, a temperature decreasing process of stopping the heater or decreasing heat generated by the heater after the process of heating the inside of the process chamber, and a process of supplying a cleaning gas to the gas supply pipe by using the gas supply system after the temperature decreasing process.

(Supplementary Note 4)

The substrate processing apparatus of Supplementary Note 3, further includes a temperature detecting unit connected to detect an inside temperature of the process chamber, wherein if the control unit recognizes a temperature detected by the temperature detecting unit and ranging from 600° C. to 900° C. during the process of heating the inside of the process chamber, the control unit performs the temperature decreasing process, and if the control unit recognizes a temperature detected by the temperature detecting unit and ranging from 350° C. to 550° C. during the temperature decreasing process, the control unit performs the process of supplying the cleaning gas to the gas supply pipe.

(Supplementary Note 5)

According to another preferred embodiment of the present invention, there is provided a method of cleaning a substrate processing apparatus including: a process chamber configured to process a substrate; a gas supply pipe installed in the process chamber; and a gas supply system configured to supply a cleaning gas to the gas supply pipe for introducing the cleaning gas into the process chamber, the method including: heating an inside of the process chamber; decreasing an inside temperature of the process chamber after the heating of the inside of the process chamber; and introducing a cleaning gas into the process chamber by supplying the cleaning gas to the gas supply pipe after the decreasing of the inside temperature of the process chamber.

(Supplementary Note 6)

In the method of Supplementary Note 5, the inside of the process chamber is heated to a temperature of 600° C. to 900° C. in the heating of the inside of the process chamber; the inside temperature of the process chamber is decreased to a temperature of 350° C. to 550° C. in the decreasing of the inside temperature of the process chamber; and the inside temperature of the process chamber is kept in a range from 350° C. to 550° C. in the introducing of the cleaning gas into the process chamber.

(Supplementary Note 7)

According to another preferred embodiment of the present invention, there is provided a method of cleaning a substrate processing apparatus including: a process chamber configured to process a substrate; a gas supply pipe installed in the process chamber; and a gas supply system configured to supply a cleaning gas to the gas supply pipe for introducing the cleaning gas into the process chamber, the method including: heating the gas supply pipe; decreasing a temperature of the gas supply pipe after the heating of the gas supply pipe; and introducing a cleaning gas into the process chamber by supplying the cleaning gas to the gas supply pipe after the decreasing of the temperature of the gas supply pipe.

(Supplementary Note 8)

In the method of Supplementary Note 7, the gas supply pipe is heated to a temperature of 600° C. to 900° C. in the heating of the gas supply pipe; the temperature of the gas supply pipe is decreased to a temperature of 350° C. to 550° C. in the decreasing of the temperature of the gas supply pipe; and an inside temperature of the process chamber is kept in a range from 350° C. to 550° C. in the introducing of the cleaning gas into the process chamber.

What is claimed is:

1. A method of manufacturing a semiconductor device, comprising:
    (a) loading a substrate into a process chamber;
    (b) forming a silicon film or a silicon compound film on the substrate loaded in the process chamber by supplying a raw-material gas to a gas supply pipe disposed in the process chamber to introduce the raw-material gas into the process chamber;
    (c) unloading the substrate from the process chamber;
    (d) heating an inside of the process chamber after unloading the substrate to generate a crack in a thin film formed inside the process chamber;
    (e) decreasing an inside temperature of the process chamber after carrying out the step (d) with the substrate unloaded from the process chamber; and
    (f) introducing a cleaning gas into the process chamber by supplying the cleaning gas to the gas supply pipe after the step (e) with the substrate unloaded from the process chamber.

2. The method of claim 1, wherein in the step (d), the inside of the process chamber is heated to a temperature of 600° C. to 900° C.;
    in the step (e), the inside temperature of the process chamber is decreased to a temperature of 350° C. to 550° C.; and
    in the step (f), the inside temperature of the process chamber is maintained in a range from 350° C. to 550° C.

* * * * *